(12) United States Patent
Oota et al.

(10) Patent No.: US 7,244,969 B2
(45) Date of Patent: Jul. 17, 2007

(54) POWER SEMICONDUCTOR DEVICE

(75) Inventors: Kenji Oota, Tokyo (JP); Yoshihiro Yamaguchi, Fukuoka (JP); Hiroshi Yamaguchi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 32 days.

(21) Appl. No.: 11/194,593

(22) Filed: Aug. 2, 2005

(65) Prior Publication Data

US 2006/0151805 A1 Jul. 13, 2006

(30) Foreign Application Priority Data

Jan. 11, 2005 (JP) .............................. 2005-003653

(51) Int. Cl.
*H01L 29/74* (2006.01)
*H01L 31/111* (2006.01)

(52) U.S. Cl. ...................................... 257/138; 257/143
(58) Field of Classification Search ................ 257/170, 257/138, 143, 147, 121, 124
See application file for complete search history.

(56) References Cited

U.S. PATENT DOCUMENTS 5,140,406 A * 8/1992 Matsuda et al. ............ 257/730
5,393,995 A 2/1995 Nakagawa et al.

FOREIGN PATENT DOCUMENTS

JP 5-343662 12/1993
JP 10-190012 7/1998

* cited by examiner

*Primary Examiner*—Theresa Doan
(74) *Attorney, Agent, or Firm*—Buchanan Ingersoll & Rooney PC (57) ABSTRACT

A power semiconductor device comprises a semiconductor substrate, a gate electrode region (control electrode region), a cathode electrode region (first main electrode region), an anode electrode region (second main electrode region) and a guard ring. The semiconductor substrate has a side surface portion having a vertical portion formed substantially vertical to a main surface and a mesa portion connected to the vertical portion in a cross section. The gate electrode region is formed in a first main surface of the semiconductor substrate. The cathode electrode region is formed in part of a surface of the gate electrode region. The anode electrode region is formed in a second main surface of the semiconductor substrate. The guard ring is formed in the second main surface of the semiconductor substrate and annularly surrounds the anode electrode region. With this constitution provided is a power semiconductor device which makes the impurity diffusion length of the anode electrode region shallower in order to ensure reduction in recovery loss.

5 Claims, 7 Drawing Sheets

POWER SEMICONDUCTOR DEVICE

BACKGROUND OF THE INVENTION

1. Field of the Invention

The present invention relates to a power semiconductor device and can be applied to, e.g., a thyristor, an IGBT or the like.

2. Description of the Background Art

In a general-type structure of a reverse blocking thyristor, conventionally, in a lower surface of a semiconductor substrate of a first conductivity type, an anode electrode region of a second conductivity type is formed.

Both side surface portions of the semiconductor substrate have a mesa structure. A lower side surface end of the semiconductor substrate, however, has a portion which is substantially vertical to a lower surface (hereinafter, referred to as "vertical portion") in order to prevent a crack in a manufacturing process or the like. In other words, in a predetermined range from the lower surface of the semiconductor substrate, the side surface portion of the semiconductor substrate is the vertical portion and the vertical portion is connected to a mesa portion thereabove.

In a cross section, the anode electrode region is formed entirely in the lower surface of the semiconductor substrate. Further, the impurity diffusion length (height) of the anode electrode region reaches the mesa portion formed above the vertical portion in order to relieve an electric field at the mesa portion of the semiconductor substrate in applying a reverse voltage.

A technique relating to the above conventional structure is disclosed in Japanese Patent Application Laid Open Gazette No. 10-190012 (Patent Document 1).

As discussed above, a thyristor needs a vertical portion of about 40 to 50 μm in the lower side surface end of the semiconductor substrate, in order to prevent a crack. Further, in order to relieve an electric field at the mesa portion on the side surface portion of the semiconductor substrate and provide the thyristor with a reverse voltage breakdown voltage in applying a reverse voltage, it is necessary for the impurity diffusion length (height) of the anode electrode region to reach the mesa portion above the vertical portion.

For the above reason, in the conventional structure, the impurity diffusion length (height) of the anode electrode region is very long (high) (at least, 50 μm or more).

Thus, as the impurity diffusion length (height) of the anode electrode region becomes longer (higher), the magnitude of a reverse current at the turn-off disadvantageously increases (in other words, a recovery loss increases). If a predetermined system carries the thyristor with large recovery loss, the efficiency of the whole system becomes low.

SUMMARY OF THE INVENTION

It is an object of the present invention to provide a power semiconductor device which makes the impurity diffusion length of an anode electrode region shallower in order to ensure reduction in recovery loss.

The present invention is intended for a power semiconductor device. According to a first aspect of the present invention, the power semiconductor device includes a semiconductor substrate, a control electrode region, a first main electrode region, a second main electrode region and a guard ring. The semiconductor substrate has a first conductivity type. The semiconductor substrate further has a side surface portion having a vertical portion formed substantially vertical to a main surface and a mesa portion connected to the vertical portion in a cross section. The control electrode region has a second conductivity type. The control electrode region is formed in a first main surface of the semiconductor substrate. The first main electrode region has a first conductivity type. The first main electrode region is formed in part of a surface of the control electrode region. The second main electrode region has a second conductivity type. The second main electrode region is formed in a second main surface of the semiconductor substrate which is opposed to the first main surface. The guard ring has an annular shape and surrounds the second main electrode region. The guard ring is formed in the second main surface of the semiconductor substrate.

The power semiconductor device of the present invention can eliminate necessity for the mesa portion to perform the function of relieving the electric field (or can reduce the degree of dependency on the mesa portion for field relieving function) in applying a reverse voltage. Accordingly, it is possible to set the impurity diffusion length of the second main electrode region smaller than the height of the vertical portion. Thus, since the impurity diffusion length of the second main electrode region can be made smaller (shallower), it is possible to reduce the reverse current at the turn-off. Therefore, by equipping a system with the power semiconductor device of the first aspect, it is possible to increase the efficiency of the whole system.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the present invention will be discussed specifically, referring to figures showing preferred embodiments.

The First Preferred Embodiment

Figure 1:
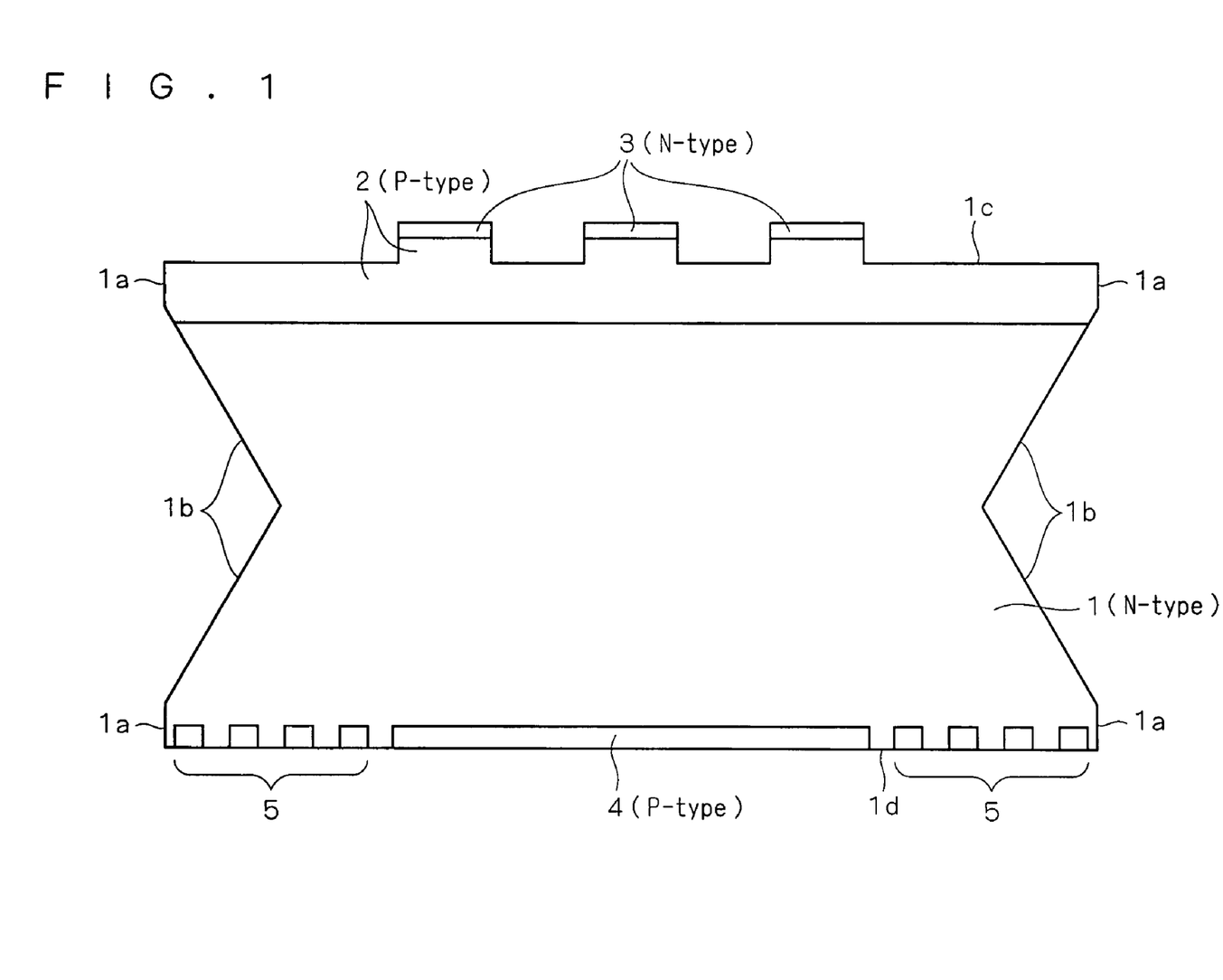
FIG. 1 is a cross section showing a structure of a power semiconductor device in accordance with a first preferred embodiment.

FIG. 1 is a cross section showing a structure of a power semiconductor device in accordance with the first preferred embodiment of the present invention. Discussion will be made below on a thyristor (especially, an NPNP-type thyristor), however, the present invention can be applied to a power transistor such as an IGBT (Insulated Gate Bipolar Transistor) or the like.

FIG. 1 shows an N-type (first conductivity type) semiconductor substrate 1. A side surface portion of the semiconductor substrate 1 has the following shape in a cross section. Specifically, the side surface portion of the semiconductor substrate 1 has a vertical portion 1a formed substantially vertical to a main surface and a mesa portion 1b connected to the vertical portion 1a.

In other words, as shown in FIG. 1, the side surface portion has the vertical portion 1a formed substantially vertical to the main surface and the mesa portion 1b constituted of inclined portions formed on a side surface of the vertical portion 1a in a cross section.

Further, as shown in FIG. 1, a gate electrode region (control electrode region) 2 is formed in a first main surface 1c (including a portion protruded from the first main surface) of the semiconductor substrate 1. This figure shows a P-type (second conductivity type) gate electrode region 2.

In other words, as shown in FIG. 1, the gate electrode region 2 is formed in part of the first main surface 1c.

Further, each cathode electrode region (first main electrode region) 3 is formed in part of a surface of the gate electrode region 2 (a protruding gate electrode region 2 in FIG. 1). This figure shows an N-type (first conductivity type) cathode electrode region 3.

In other words, as shown in FIG. 1, the cathode electrode region 3 is formed in the first main surface 1c of the semiconductor substrate 1.

Further, as shown in FIG. 1, an anode electrode region (second main electrode region) 4 is formed in a second main surface 1d of the semiconductor substrate 1. This figure shows a P-type (second conductivity type) anode electrode region 4.

In other words, as shown in FIG. 1, the anode electrode region 4 is formed in the second main surface 1d of the semiconductor substrate 1 which is opposed to the first main surface 1c.

Further, in the second main surface 1d of the semiconductor substrate 1, an annular guard ring 5 is formed, surrounding the anode electrode region 4. Though a plurality of guard rings 5 are formed in FIG. 1, there may be a case where only a single guard ring 5 is formed.

Next, a manufacturing method of the power semiconductor device (thyristor) in accordance with the first preferred embodiment will be discussed, referring to process cross-sections.

Figure 2:
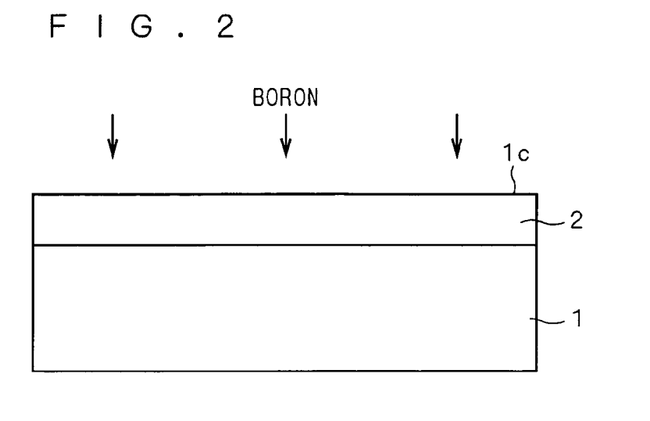
FIGS. 2 to 5 are process cross-sections used for explanation of a manufacturing method of the power semiconductor device in accordance with the first preferred embodiment.

First, the N-type semiconductor substrate 1 is prepared. Then, boron is implanted into the first main surface 1c of the semiconductor substrate 1. With this implantation, as shown in FIG. 2, the gate electrode region 2 having a predetermined depth is formed in the first main surface 1c of the semiconductor substrate 1.

Figure 3:
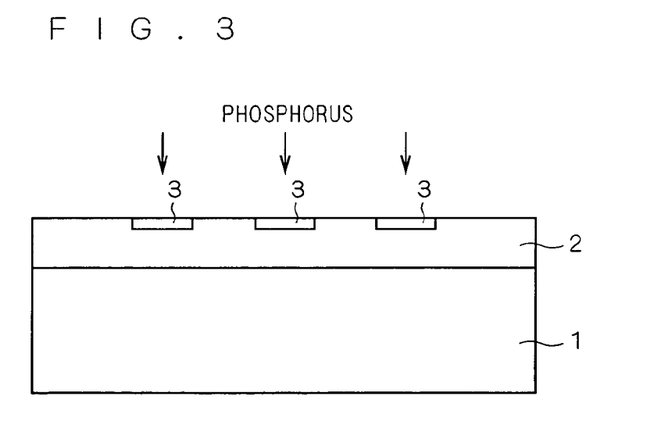

Next, phosphorus is implanted into a predetermined region of the gate electrode region 2. With this implantation, as shown in FIG. 3, the cathode electrode regions 3 each having a predetermined depth are formed in a predetermined region of a surface of the gate electrode region 2.

Figure 4:
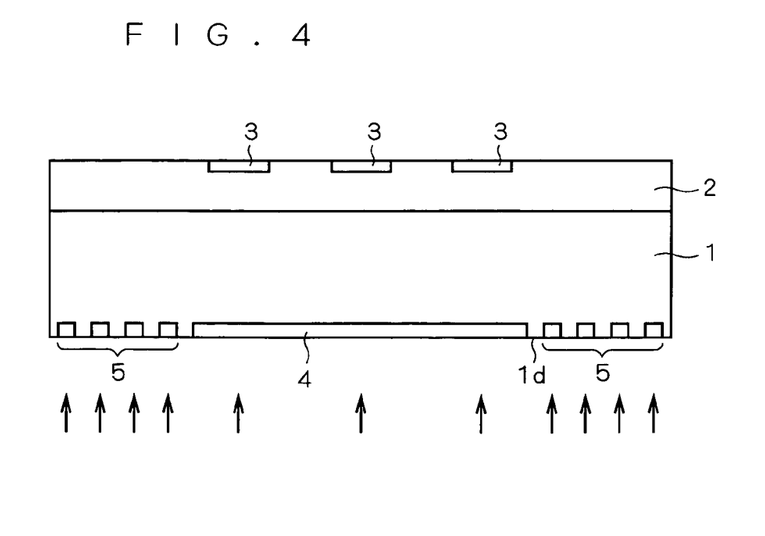

Next, boron is implanted into a predetermined region of the second main surface 1d of the semiconductor substrate 1. With this implantation, as shown in FIG. 4, the anode electrode region 4 having a predetermined depth is formed in a predetermined region of the second main surface 1d of the semiconductor substrate 1. Further, a plurality of guard rings 5 are so formed in the second main surface 1d of the semiconductor substrate 1 as to annularly surround the anode electrode region 4.

Formation of the anode electrode region 4 and that of the guard rings 5 may be performed in different process steps.

By forming the anode electrode region 4 and the guard rings 5 at the same time, however, the manufacturing process can be simplified. Thus, if the anode electrode region 4 and the guard rings 5 are formed at the same time, the impurity diffusion length of the anode electrode region 4 and that of the guard ring 5 become almost equal to each other.

Further, the impurity diffusion length of the anode electrode region 4 is sufficiently smaller than the height of the vertical portion 1a. For example, the height of the vertical portion 1a is 40 to 50 μm and the impurity diffusion length of the anode electrode region 4 is about 10 μm.

Figure 5:
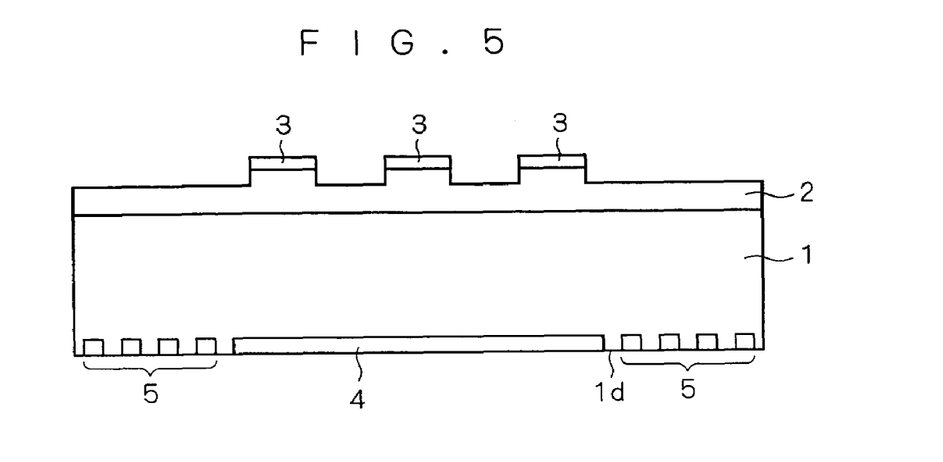

Next, etching is performed on part of the gate electrode region 2 so as to protrude a region where the cathode electrode region 3 is formed. With this etching, the gate electrode region 2 having such a shape as shown in FIG. 5 is formed.

After that, the side surface portion of the semiconductor substrate 1 is so ground into a predetermined shape as to leave the vertical portion 1a at the side surface end. Further, in order to smooth the ground surface, etching is performed on the ground surface. With this etching, as shown in FIG. 1, the power semiconductor device (NPNP-type thyristor) having the mesa structure in accordance with the first preferred embodiment is completed.

Thus, in the power semiconductor device of the first preferred embodiment, the guard rings 5 are formed around the anode electrode region 4. This eliminates the necessity for the mesa portion 1b to perform the function of relieving the electric field (this electric field becomes largest at the interface between the semiconductor substrate 1 and the anode electrode region 4) (or further reduces the field relieving function dependent on the mesa portion 1b) in applying the reverse voltage (specifically, applying a negative voltage to the anode electrode region 4 and applying a positive voltage to the cathode electrode region 3). In other words, the guard rings 5 perform the function of relieving the electric field. Therefore, it becomes possible to set the impurity diffusion length of the anode electrode region 4 smaller than the height of the vertical portion 1a.

Figure 6:
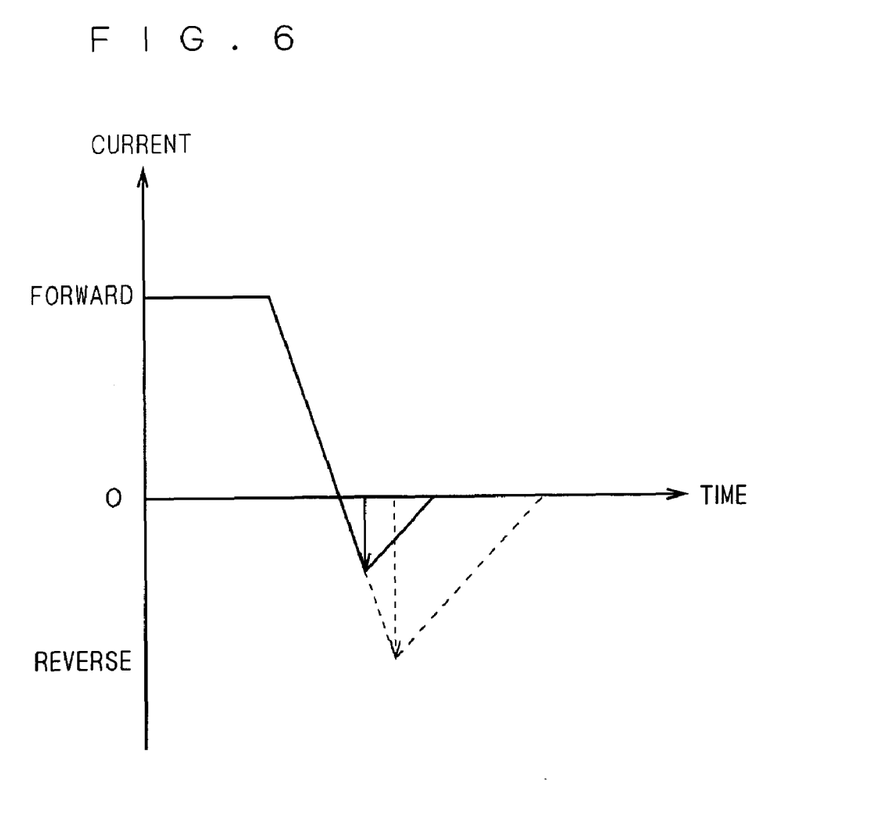
FIG. 6 is a graph showing an effect of the power semiconductor device in accordance with the first preferred embodiment.

Thus, since the impurity diffusion length of the anode electrode region 4 can be made smaller (shallower), it is possible to reduce the reverse current at the turn-off, as shown in FIG. 6.

In FIG. 6, the vertical axis indicates a current value and the horizontal axis indicates time. The broken line indicates variation in reverse current from the conducting state to the turn-off (reverse recovery characteristic) in the power semiconductor device of the background art. The solid line indicates variation in reverse current from the conducting state to the turn-off (reverse recovery characteristic) in the power semiconductor device of the preferred embodiment. As clearly can be seen from FIG. 6, the maximum reverse current value is smaller in the first preferred embodiment of the present invention.

Therefore, by equipping a predetermined system with the power semiconductor device of the first preferred embodiment, it is possible to further increase the efficiency of the whole system. For example, by using the power semiconductor device of the first preferred embodiment, it is possible to reduce the recovery loss by about 20% as compared with the case where the power semiconductor device of the background art is used.

Further, as shown in FIG. 1, the impurity diffusion length of the gate electrode region 2 is larger than the height of the vertical portion 1a. Therefore, the electric field (this electric field becomes largest at the interface between the semiconductor substrate 1 and the gate electrode region 2) in applying a forward voltage (specifically, applying a positive voltage to the anode electrode region 4 and applying a negative voltage to the cathode electrode region 3) is relieved by the mesa portion 1b.

Figure 7:
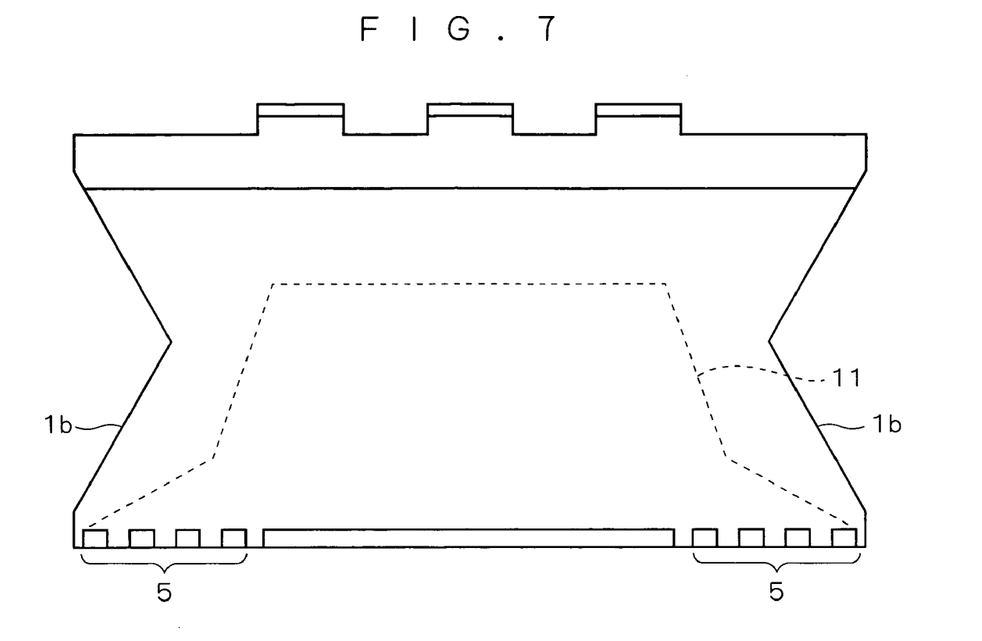
FIG. 7 is a cross section showing the power semiconductor device in a state where ends of a depletion layer does not reach a mesa structure in applying a reverse voltage.

The electric field in applying the reverse voltage can be relieved only by the guard rings 5 (in other words, it is possible to withstand the reverse voltage only with the guard rings 5). FIG. 7 shows this field relieving. As shown in FIG. 7, ends of a depletion layer 11 reach only the guard rings 5 and does not reach the mesa portion 1b. This means that the electric field in applying the reverse voltage does not reach the mesa portion 1b.

In the above case where the electric field in applying the reverse voltage is relieved only by the guard rings 5, it is possible to prevent generation of surface leakage current which is produced at the mesa portion 1b in applying the reverse voltage. Therefore, it is possible to reduce the leakage current generated in applying the reverse voltage on the whole of the power semiconductor device.

Figure 8:
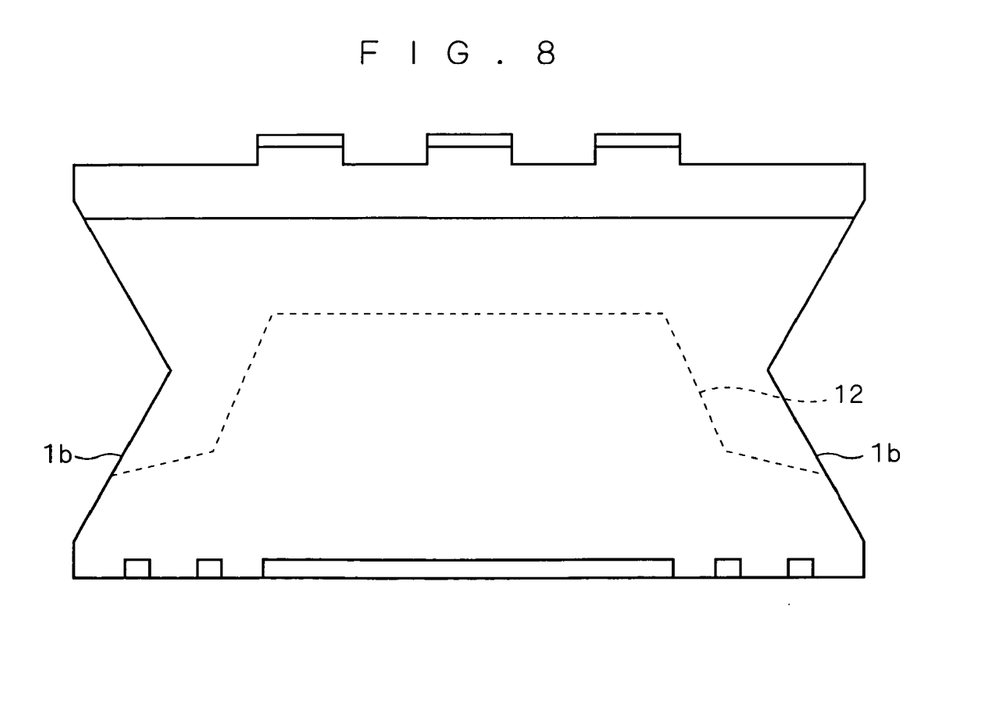
FIG. 8 is a cross section showing the power semiconductor device in a state where the ends of the depletion layer reaches the mesa structure in applying a reverse voltage.

On the other hand, it is also possible to relieve the electric field in applying the reverse voltage by the guard rings 5 and the mesa portion 1b (in other words, it is possible to withstand the reverse voltage with the guard rings 5 and the mesa portion 1b). FIG. 8 shows this field relieving. As shown in FIG. 8, ends of a depletion layer 12 reach the mesa portion 1b. This means that the electric field in applying the reverse voltage reaches the mesa portion 1b. Therefore, the electric field in applying the reverse voltage is relieved by the guard rings 5 and the mesa portion 1b.

The depletion layers 11 and 12 shown in FIGS. 7 and 8 can be selected by controlling the number of guard rings 5, the interval of the guard rings 5, the concentration of the guard ring 5, the height of the guard ring 5 and the angle of inclination of the mesa portion 1b, and the like. For example, increasing the number of guard rings 5 produces tendency of forming the depletion layer 11 shown in FIG. 7.

Therefore, in the case of forming the depletion layer 12 shown in FIG. 8, since a relatively small number of guard rings 5 are needed, it is possible to reduce the area of the whole power semiconductor device in a plan view.

Further, as the depth of the guard ring 5 becomes larger or the concentration of the guard ring 5 becomes smaller, the depletion layer is more likely to have a shape reaching only the guard ring 5, instead of a shape reaching the guard ring 5 and the mesa portion 1b.

The Second Preferred Embodiment

Figure 9:
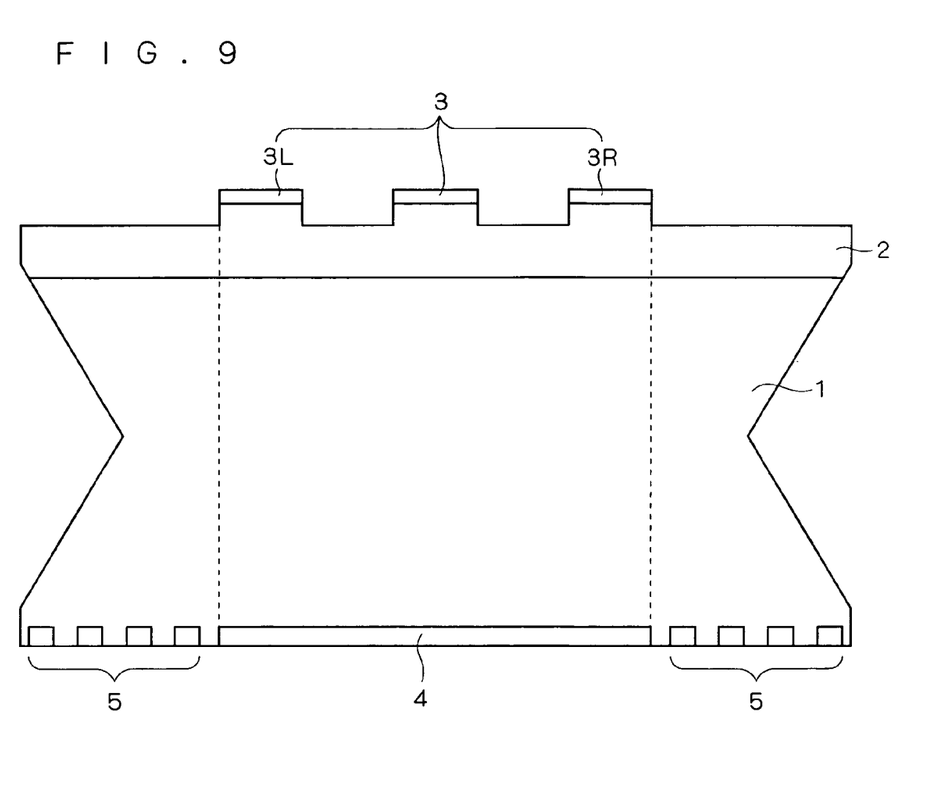
FIG. 9 is a cross section showing a structure of a power semiconductor device in accordance with a second preferred embodiment.

The characteristic feature of the power semiconductor device of the second preferred embodiment lies in specification of the section width of the anode electrode region 4. FIG. 9 is a cross section showing a structure of the power semiconductor device in accordance with the second preferred embodiment.

As shown in FIG. 9, a plurality of cathode electrode regions 3 (three in this figure) are formed along the horizontal direction of this figure in a cross section. Herein, outermost two cathode electrode regions 3L and 3R in this cross section are specified.

An outer end of the cathode electrode region 3L (the leftmost one in this figure) and one end of the anode electrode region 4 are substantially coincident with each other in a plan view. In other words, as shown in FIG. 9, the one end of the anode electrode region 4 is positioned vertically below (in a lower direction of this figure) the outer end of the cathode electrode region 3L (see the left broken line in FIG. 9).

An outer end of the cathode electrode region 3R (the rightmost one in this figure) and the other end of the anode electrode region 4 are substantially coincident with each other in a plan view. In other words, as shown in FIG. 9, the other end of the anode electrode region 4 is positioned vertically below (in a lower direction of this figure) the outer end of the cathode electrode region 3R (see the right broken line in FIG. 9).

Figure 10:
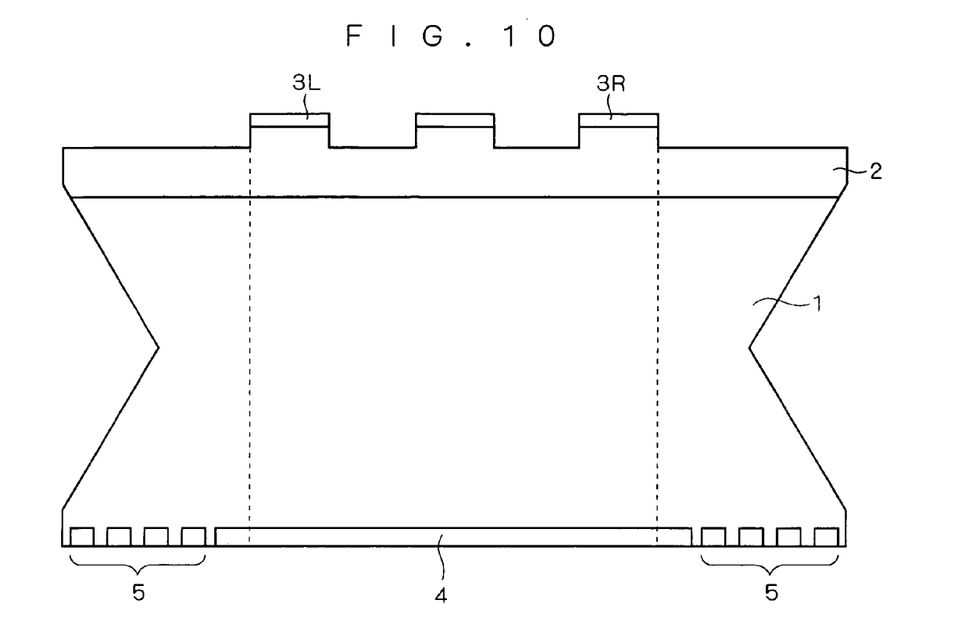
FIG. 10 is a cross section showing a case where the section width of an anode electrode region is relatively large.
Figure 11:
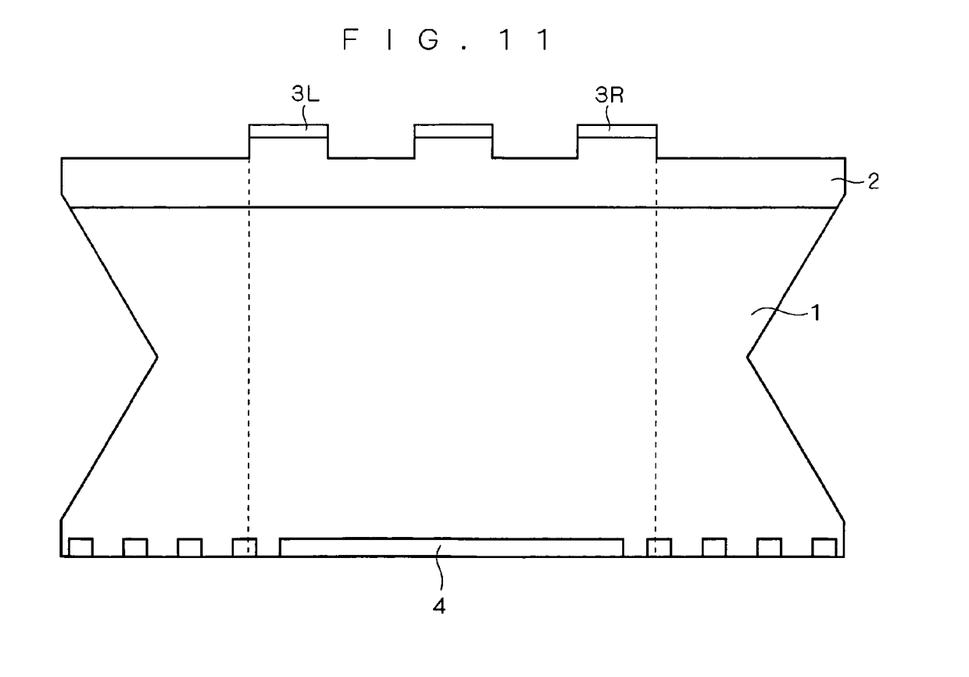
FIG. 11 is a cross section showing a case where the section width of the anode electrode region is relatively small.

As shown in FIG. 10, however, if the section width of the anode electrode region 4 is larger than the width shown in FIG. 9, the recovery loss increases. On the other hand, as shown in FIG. 11, if the section width of the anode electrode region 4 is smaller than the width shown in FIG. 9, the area contributing to energization becomes smaller. As a result, the ineffective area of the power semiconductor device increases.

From the above reason, with such a section width of the anode electrode region 4 as shown in FIG. 9, it is possible to suppress an increase in recovery loss and suppress an increase of the ineffective area.

The Third Preferred Embodiment

Figure 12:
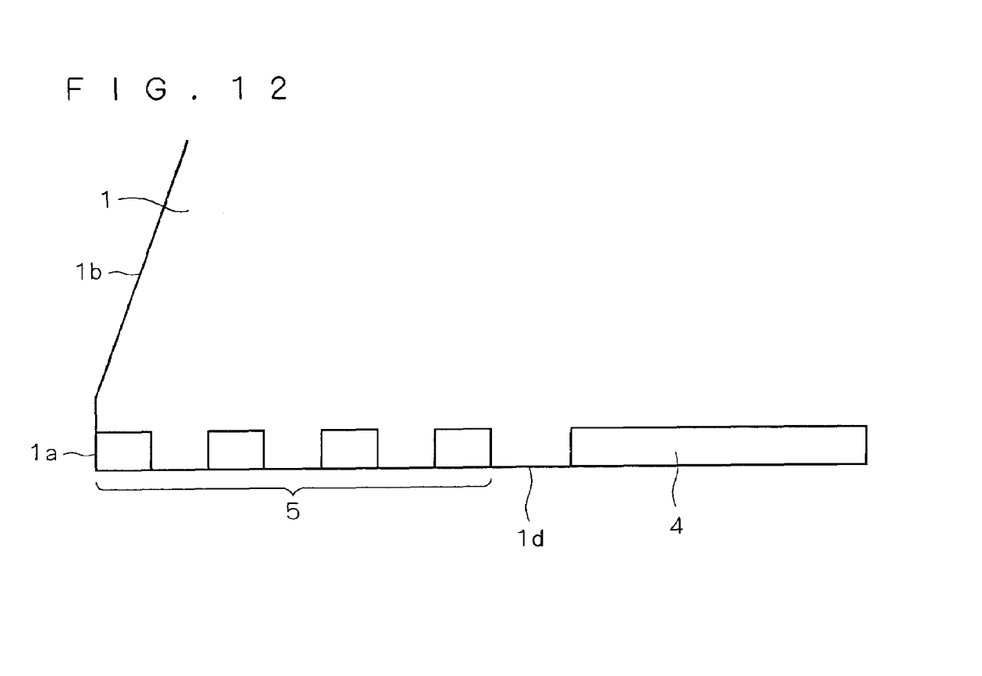
FIG. 12 is a cross section showing a structure of a power semiconductor device in accordance with a third preferred embodiment.

FIG. 12 is an enlarged cross section showing a lower side structure of a power semiconductor device in accordance with the third preferred embodiment.

As shown in FIG. 12, the outermost guard ring 5 is formed at the end of the second main surface 1d of the semiconductor substrate 1. In other words, the outermost guard ring 5 is connected to the vertical portion 1a.

By forming the guard rings 5 as discussed above, it is possible to suppress concentration of the electric field in applying the reverse voltage at the vertical portion 1a.

FIG. 12 shows the case where the impurity diffusion length of the guard ring 5 is smaller than the height of the vertical portion 1a of the semiconductor substrate 1.

Figure 13:
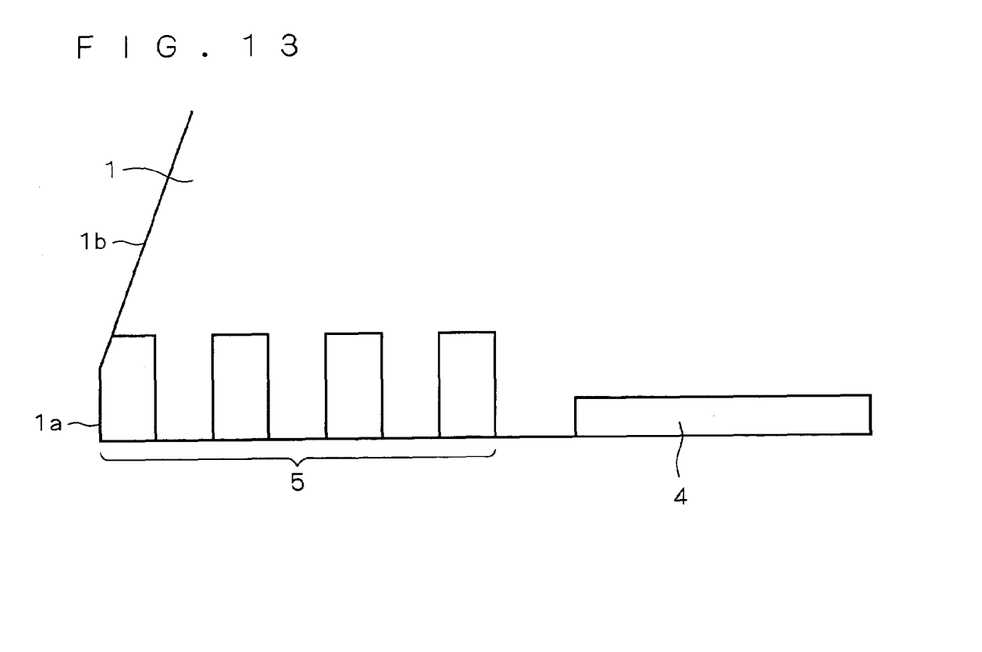
FIG. 13 is a cross section showing another structure of the power semiconductor device in accordance with the third preferred embodiment.

Herein, as shown in FIG. 13, the impurity diffusion length of the guard ring 5 may be larger than the height of the vertical portion 1a of the semiconductor substrate 1. In other words, the diffusion length of the outermost guard ring 5 may reach the mesa portion 1b. In this case, the outermost guard ring 5 is connected to the vertical portion 1a and the mesa portion 1b.

By using the guard ring structure as shown in FIG. 13, the electric field in applying the reverse voltage reaches the mesa portion 1b. Therefore, the electric field can be relieved by the mesa portion 1b and it is possible to further improve field relieving at the side surface of the semiconductor substrate 1.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   a semiconductor substrate of a first conductivity type, having a side surface portion which has a) a vertical portion formed substantially vertical to a main surface and b) a mesa portion connected to said vertical portion in a cross section;
   a control electrode region of a second conductivity type, being formed in a first main surface of said semiconductor substrate;
   a first main electrode region of said first conductivity type, being formed in part of a surface of said control electrode region;
   a second main electrode region of said second conductivity type, being formed in said main surface of said semiconductor substrate which is opposed to said first main surface; and
   an annular guard ring formed in said main surface of said semiconductor substrate, surrounding said second main electrode region.

2. The power semiconductor device according to claim 1, wherein
   a plurality of said first main electrode regions are horizontally arranged in a cross section, and
   among two of said first main electrode regions which are positioned outermost in said cross section,
   one of said first main electrode regions has an outer end which is substantially coincident with one end of said second main electrode region in a plan view and
   the other one of said first main electrode regions has an outer end which is substantially coincident with the other end of said second main electrode region in a plan view.

3. The power semiconductor device according to claim 1, wherein said guard ring is formed at an end of said main surface.

4. The power semiconductor device according to claim 3, wherein the height of said guard ring reaches said mesa portion.

5. The power semiconductor device according to claim 1, wherein
   the height of said main electrode region and that of said guard ring are substantially equal to each other.

* * * * *